(12) United States Patent
Gardner et al.

(10) Patent No.: US 12,171,147 B2
(45) Date of Patent: Dec. 17, 2024

(54) SEMICONDUCTOR-SUPERCONDUCTOR HYBRID DEVICE AND ITS FABRICATION

(71) Applicant: Microsoft Technology Licensing, LLC, Redmond, WA (US)

(72) Inventors: Geoffrey Charles Gardner, West Lafayette, IN (US); Asbjørn Cennet Cliff Drachmann, Copenhagen (DK); Charles Masamed Marcus, Copenhagen (DK); Michael James Manfra, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/561,330

(22) Filed: Dec. 23, 2021

(65) Prior Publication Data

US 2022/0149262 A1 May 12, 2022

Related U.S. Application Data

(62) Division of application No. 16/796,671, filed on Feb. 20, 2020, now Pat. No. 11,211,543.

(Continued)

(51) Int. Cl.
*H10N 60/01* (2023.01)
*H10N 60/10* (2023.01)
(Continued)

(52) U.S. Cl.
CPC ......... *H10N 60/01* (2023.02); *H10N 60/0156* (2023.02); *H10N 60/0912* (2023.02);
(Continued)

(58) Field of Classification Search
CPC ............... H10N 60/01; H10N 60/0156; H10N 60/0912; H10N 60/10; H10N 60/12; H10N 60/805; H10N 60/85; H10N 60/128
See application file for complete search history.

(56) References Cited

U.S. PATENT DOCUMENTS

| 4,904,980 A | 2/1990 | Przybysz |
| 5,084,437 A * | 1/1992 | Talvacchio ............. H01L 21/86 438/650 |

(Continued)

FOREIGN PATENT DOCUMENTS

| EP | 0968979 A1 | 1/2000 |
| JP | S6224677 A | 2/1987 |

(Continued)

OTHER PUBLICATIONS

Zhang, H., Liu, CX., Gazibegovic, S. et al. Retracted Article: Quantized Majorana conductance. Nature 556, 74-79 (2018). https://doi.org/10.1038/nature26142 (Year: 2017).*

(Continued)

*Primary Examiner* — Matthew L Reames
(74) *Attorney, Agent, or Firm* — Klarquist Sparkman, LLP

(57) ABSTRACT

A method of fabricating a semiconductor-superconductor hybrid device comprises providing a workpiece comprising a semiconductor component, a layer of a first superconductor material on the semiconductor component, and a layer of a second superconductor material on the first superconductor material, the second superconductor material being different from the first superconductor material; etching the layer of the second superconductor material to expose a portion of the first superconductor material; and oxidising the portion of the first superconductor material to form a passivating layer on the semiconductor. The first superconductor pro- (Continued)

vides energy coupling between the semiconductor and the second superconductor, and the passivating layer protects the semiconductor while allowing electrostatic access thereto. Also provided are a hybrid device, and a method of etching.

21 Claims, 5 Drawing Sheets

Related U.S. Application Data

(60) Provisional application No. 62/944,093, filed on Dec. 5, 2019.

(51) Int. Cl.
*H10N 60/12* (2023.01)
*H10N 60/80* (2023.01)
*H10N 60/85* (2023.01)

(52) U.S. Cl.
CPC ............. *H10N 60/10* (2023.02); *H10N 60/12* (2023.02); *H10N 60/805* (2023.02); *H10N 60/85* (2023.02); *H10N 60/128* (2023.02)

(56) References Cited

U.S. PATENT DOCUMENTS

| | | | |
|---|---|---|---|
| 11,211,543 | B2 | 12/2021 | Gardner et al. |
| 11,380,836 | B2 * | 7/2022 | Holmes .................. H10N 60/12 |
| 2003/0194867 | A1 | 10/2003 | Kudelka |
| 2007/0059645 | A1 | 3/2007 | Tang |
| 2020/0227636 | A1 | 7/2020 | Krogstrup et al. |
| 2021/0175408 | A1 | 6/2021 | Gardner et al. |
| 2023/0008150 | A1 | 1/2023 | Upadhyay et al. |
| 2023/0012371 | A1 | 1/2023 | Krogstrup Jeppesen et al. |

FOREIGN PATENT DOCUMENTS

| | | |
|---|---|---|
| JP | 2002094370 A | 3/2002 |
| JP | 2009048778 A | 3/2009 |
| JP | 2010232562 A | 10/2010 |
| JP | 2019532506 A | 11/2019 |
| KR | 10-1535386 B1 | 7/2015 |
| KR | 20190033634 A | 3/2019 |
| KR | 20190040061 A | 4/2019 |
| WO | 2019151141 A1 | 8/2019 |
| WO | 2021093977 A1 | 5/2021 |

OTHER PUBLICATIONS

Qing Lin He et al. ,RETRACTED: Chiral Majorana fermion modes in a quantum anomalous Hall insulator-superconductor structure. Science357,294-299(2017).DOI:10.1126/science.aag2792 (Year: 2018).*

Intention to Grant received for EP Application No. 20830437.8, mailed on Nov. 15, 2023, 7 Pages.

Dow, Microposit MF-321 Developer, Material Safety Data Sheet, Apr. 18, 2008, 6 pages.

Non-Final Office Action mailed on Oct. 19, 2023, in U.S. Appl. No. 17/756,813, 11 pages.

Intention to Grant received for Application No. 20830437.8, mailed on Nov. 15, 2023, 7 Pages.

Communication under Rule 71(3) EPC Received for European Application No. 20830437.8, mailed on Apr. 17, 2024, 7 pages.

Alicea, Jason, "Majorana Fermions in a Tunable Semiconductor Device", In the Repository of arXiv:0912.2115v1, Dec. 10, 2009, 10 Pages.

Court, et al., "Energy gap measurement of nanostructured thin aluminum films for use in single Cooper-pair devices", In Journal of Superconductor Science and Technology, Vol 21, No. 1, Nov. 27, 2007, 9 Pages.

Decision to Grant Received for Japan Application No. 2022-533642, mailed on May 7, 2024, 5 pages.

Grosfeld, et al., "Observing Majorana Bound States of Josephson Vortices In Topological Superconductors", In the Repository of arXiv: 1012.2492v2, Aug. 18, 2011, 10 Pages.

International Search Report and Written Opinion Issued in PCT Application No. PCT/EP19/083904, Mailed Date: Oct. 7, 2020, 12 Pages.

Linder, et al., "Majorana Fermions Manifested as Interface-States in Semiconductor Hybrid Structures", In the Repository of arXiv: 1004.3786v1, Apr. 21, 2010, 4 Pages.

Notice of Allowance Received for Korean Application No. 10-2022-7017934, mailed on Apr. 25, 2024, 8 pages (English Translation Provided).

Office Action received for Indian Application No. 202247030042, mailed on May 1, 2024, 6 pages.

Office Action Received for Korean Application No. 10-2022-701934, mailed on Jan. 22, 2024, 7 pages.

Office Action Received in Japanese Application No. 222-533642, mailed on Nov. 14, 2023, 7 pages.

Wu, et al., "Chiral Majorana Fermion Edge States in A Heterostructure Of Superconductor and Semiconductor With Spin-Orbit Coupling", In The Journal of Physics: Conference Series, vol. 393, Jul. 9, 2012, 6 pages.

Extended European Search Report and Written Opinion received for PCT Application No. 24160621.9, Jun. 21, 2024, 6 pages.

Notice of allowance mailed on Jun. 18, 2024, in U.S. Appl. No. 17/756,813, 08 pages.

Decision to Grant Received for European Application No. 20830437.8, mailed on Aug. 8, 2024, 2 pages.

Office Action received for Japanese Application No. 2022-530890, mailed on Sep. 10, 2025, 10 pages.

* cited by examiner

SEMICONDUCTOR-SUPERCONDUCTOR HYBRID DEVICE AND ITS FABRICATION

CROSS-REFERENCE TO RELATED APPLICATIONS

This application is a divisional of U.S. application Ser. No. 16/796,671, filed on Feb. 20, 2020, which application claims the benefit of U.S. Provisional Application No. 62/944,093 entitled "SEMICONDUCTOR-SUPERCONDUCTOR HYBRID DEVICE AND ITS FABRICATION" filed on Dec. 5, 2019, which applications are hereby incorporated herein in their entirety.

BACKGROUND

Certain semiconductor-superconductor hybrid devices have applications in quantum computing, for example, topological quantum computing.

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this in some instances requires a magnetic field, conventionally applied externally, and also cooling of the nanowire to, or below, a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

To induce MZMs, the device is cooled to a temperature where the superconductor (e.g. Aluminium) exhibits superconducting behaviour. Under the right circumstances, the superconductor causes a proximity effect in the adjacent semiconductor, whereby a region of the semiconductor near the interface with the superconductor also exhibits superconducting properties. I.e., a topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level split between the differently spin-polarized electrons. This is known as the Zeeman effect. The g-factor refers to the coefficient between the applied magnetic field and the spin splitting. Typically, the magnetic field is applied by an external electromagnet.

SUMMARY

Provided is a method of fabricating a semiconductor-superconductor hybrid device. The method comprises: providing a workpiece comprising a semiconductor component, a layer of a first superconductor material on the semiconductor component, and a layer of a second superconductor material on the layer of first superconductor material, the second superconductor material being different from the first superconductor material; etching the layer of the second superconductor material to expose a portion of the first superconductor material; and oxidising the portion of the first superconductor material to form a passivating layer on the semiconductor component.

Also provided is a semiconductor-superconductor hybrid device. The device comprises a semiconductor component; a first superconductor component over a first portion of the semiconductor component, the first superconductor component comprising a first superconductor material; a second superconductor component on the first superconductor component, the second superconductor component comprising a second superconductor material different from the first superconductor material; and a passivating layer over a second portion of the semiconductor component, the passivating layer comprising an oxide of the first superconductor material.

Further provided is a method of etching a workpiece comprising a lead component. The method comprises: forming a mask on the lead component, the mask defining exposed regions of the lead component; and contacting the exposed regions with an etchant composition. The etchant composition comprises acetic acid and propan-2-ol.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which.

DETAILED DESCRIPTION OF EMBODIMENTS

I. General Considerations and Overview

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the device when viewed in the orientation illustrated in FIG. 2. For the avoidance of any doubt, this terminology is not intended to limit the orientation of the device in an external frame of reference.

The term "on" where used to describe relationships between components typically means "directly on", unless context clearly dictates otherwise.

As used herein, the term "superconductor" refers to a material which becomes superconductive when cooled to a temperature below a critical temperature, Tc, of the material. The use of this term is not intended to limit the temperature of the device.

A "nanowire" as referred to herein is an elongate member having a nano-scale width, and a length-to-width ratio of at least 100, or at least 500, or at least 1000. A typical example of a nanowire has a width in the range 10 to 500 nm, optionally 50 to 100 nm or 75 to 125 nm. Lengths are typically of the order of micrometres, e.g. at least 1 μm, or at least 10 μm.

The term "coupling" in the context of the present disclosure refers in particular to the hybridisation of energy levels between two materials or components.

Volumes are measured at 25° C. and a pressure of 1 atm (101325 Pa).

The term "workpiece" may refer in particular to an unfinished device obtained after one or more fabrication steps.

Where used in connection with a numeral, the term "about" means that the value may vary by ±10% of the stated value.

The content of all documents cited herein is hereby incorporated by reference in its entirety.

Semiconductor-superconductor hybrid devices which use aluminium as the superconductor component have been investigated. Aluminium has various favourable properties, including good lattice matching with, and good coupling to, various semiconductor materials.

Described herein are semiconductor-superconductor hybrid devices in which a first superconductor connects a further superconductor to a semiconductor, and in which a passivating layer protects the semiconductor component from degradation.

Figure 1:
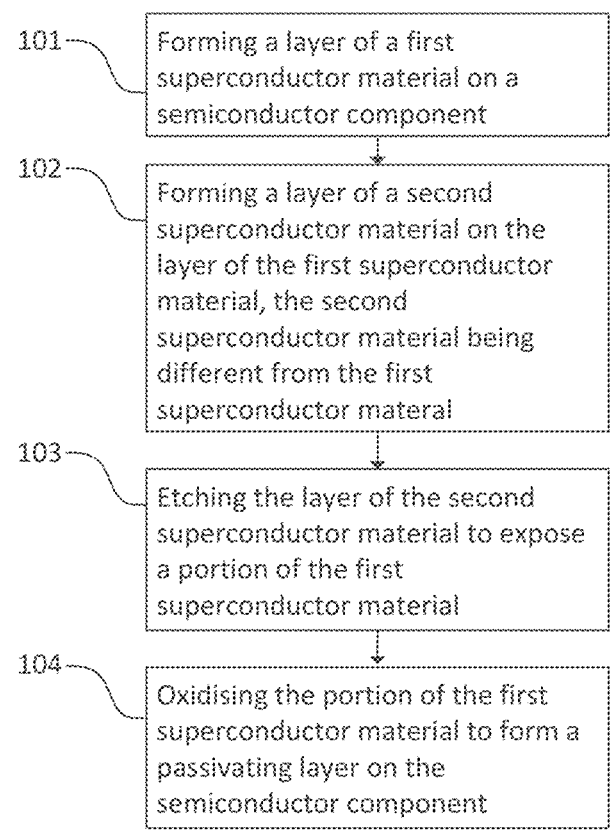
FIG. 1 is a flow chart outlining a method of fabricating a semiconductor-superconductor hybrid device.

A method of fabricating a semiconductor-superconductor hybrid device will now be described with reference to FIGS. 1 and 2.

At block 101, a layer of a first superconductor material is formed on a semiconductor component. Typically, the layer of the first superconductor material is grown epitaxially on the semiconductor component.

Figure 2A:
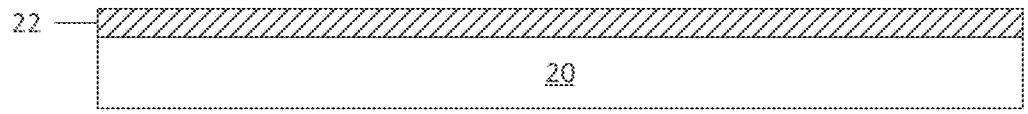
FIG. 2a to g are schematic cross-sections of workpieces at various steps of the method of FIG. 1, with FIG. 2g showing an illustrative semiconductor-superconductor hybrid device (FIG. 2 is schematic and is not to scale. The relative proportions of components shown in this FIG. may be exaggerated for ease of representation).

This step forms a workpiece as illustrated schematically in FIG. 2a. FIG. 2a shows a semiconductor component 20 with a layer of first superconductor material 22 arranged directly on the semiconductor component 20.

The nature of the material which forms the semiconductor component is not particularly limited.

For example, silicon, germanium, or silicon/germanium semiconductors may be used.

Alternatively, the semiconductor component may comprise a III-V semiconductor. Examples of useful III-V semiconductor materials include those of general formula:

$$InAs_xSb_{1-x} \hspace{2cm} \text{(Formula 1)}$$

where x is in the range 0 to 1. In other words, semiconductor component 20 may comprise indium antimonide (x=0), indium arsenide (x=1), or a ternary mixture comprising 50% indium on a molar basis and variable proportions of arsenic and antimony (0<x<1).

Indium arsenide, InAs, has been found to have good handling properties, and provides devices with good performance Indium antimonide, InSb, may provide further improvements to device performance but may have less favourable handling properties. The ternary mixtures have intermediate properties between those of the binary compounds InAs and InSb. Improvements in device performance compared to InAs may be observed when x is in the range 0 to 0.7, or 0.01 to 0.7. Values of x in the range 0.35 to 0.45 may provide a particularly good balance of device performance and handling properties.

The semiconductor component may comprise indium arsenide. As components of hybrid devices may be fabricated by epitaxial growth processes, good lattice matching between component materials may be desirable. Indium arsenide has good compatibility with aluminium in particular.

FIG. 2 shows a single layer of semiconductor. More than one semiconductor component may be present. For example, there may be a first semiconductor component in the form of a nanowire, supported by a second semiconductor component in the form of a wafer. A more elaborate device may comprise a network of nanowires arranged on a wafer, or a semiconductor heterostructure comprising a shallow planar electron gas.

Indium phosphide is one example of a semiconductor which may be useful as a wafer material. Indium phosphide has a higher band-gap than materials of Formula 1, so may not interfere with the operation of devices based on these materials.

The first superconductor material is selected to be a material which may be readily grown on the semiconductor material. Good lattice matching between the first superconductor material and semiconductor material may be helpful in this regard. The first superconductor material is further selected such that a second superconductor component can be selectively etched. For example, the first superconductor component may be selected such that an etchant for the second superconductor material does not etch the first superconductor material. The first superconductor component may be selected such that an etchant for the second superconductor material etches the first superconductor component at a rate which is slow enough to allow selective removal of the second superconductor material while retaining the first superconductor material.

The first superconductor material may be a material which undergoes self-limiting oxidation to a certain depth, for example when exposed to atmospheric oxygen. The first superconductor material desirably forms an oxide which acts as a dielectric.

Aluminium may be particularly preferred as the first superconductor material. A variant uses indium as the first superconductor material.

The thickness of the layer of first superconductor material is selected to allow for formation of a passivating layer later in the process. A passivating layer is a layer that protects the semiconductor component from reactive species, while allowing access to the semiconductor component. "Access" in the present context means that an electrostatic field can be applied to the semiconductor component through the passivating layer.

The thickness of the layer of first superconductor material may be selected such that the complete thickness of the exposed portions of the first superconductor material will oxidise at block 104. The precise thickness for achieving this varies depending on the superconductor material chosen, the selected reaction conditions, and the orientation of the crystal of first superconductor material, amongst other things.

In examples where the first superconductor material is aluminium, the layer of first superconductor material typically has a thickness of less than or equal to 4 nm, for example, 2 to 3 nm. Aluminium layers of thickness less than or equal to 3 nm will typically fully oxidise when exposed to atmospheric oxygen. The layer of aluminium may have a thickness of at least 2 nm, because continuous layers thinner than this are more difficult to manufacture reliably.

In examples where the first superconductor material is indium, the layer of first superconductor material may have a thickness of less than or equal to 10 nm, optionally less than or equal to 8 nm. When exposed to oxygen in the air, indium layers will oxidise down to a depth of approximately 10 nm.

If the subsequent etching step at block 104 will partially etch the first superconductor layer, then the starting layer thickness may be increased to compensate for this.

Figure 2B:
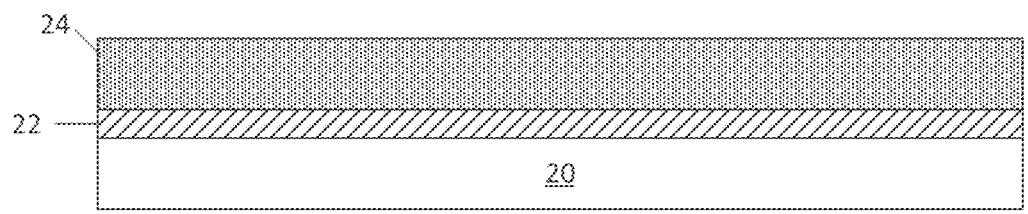

At block 102, a layer of a second superconductor material 24 is formed on the layer of the first superconductor material 22. The second superconductor material is different from the first superconductor material. A workpiece obtained by this step is illustrated in FIG. 2b.

Although aluminium has good compatibility with semiconductor materials, it has a relatively small superconducting gap. A layer of a further superconductor having a larger superconducting gap may be formed on the aluminium layer. The aluminium layer may facilitate epitaxial growth of the layer of second superconductor. The aluminium layer may provide good coupling between the semiconductor component and the second superconductor.

The semiconductor material and the first superconductor material may be selected so as to avoid a large Schottky barrier, in other words high resistance, at an interface between the semiconductor material and the first superconductor material. For example, the materials of Formula 1 typically do not form a large Schottky barrier when interfacing with metals such as aluminium. Instead, the conduction band at the surface of the semiconductor can be pulled down below the chemical potential. This may allow good transport across the interface and a good proximity effect when the first superconductor material is in a superconducting phase.

Generally, metals have plenty of occupied and available electron states around the chemical potential ensuring good transport across metal-metal interfaces.

Consequently, by providing the layer of first superconductor between the semiconductor component and the layer of second superconductor, improved energy coupling of the second superconductor to the semiconductor component may be achieved.

Examples of materials useful as the second superconductor include Pb, Sn, V, In, Nb, Ta, Re, NbN, NbTiN, $MgB_2$, MoRe, and Fe-based superconductors. In principle, the second superconductor material may be any superconductor material which can be etched selectively from the first superconductor material.

The second superconductor material may for example be selected from indium, vanadium, niobium, and lead; e.g. indium, vanadium and lead; more particularly, lead. Layers of these materials may be grown at low temperatures, e.g. temperatures below 0° C. The use of low temperatures may be preferred when aluminium is used as the first superconductor material. Thin layers of aluminium tend to become discontinuous if exposed to excessive heat.

Lead may be particularly preferred for some applications. Lead has a superconductor gap which is about 6 times greater than that of aluminium. A large superconductor gap may be useful in the context of a device for topological quantum computing, because it may increase the energy gap between the computationally-useful Majorana zero modes and higher energy states. It is desirable to avoid transfer of electrons from Majorana zero modes into higher energy states as this may result in the loss of information.

At block 103, a portion of the layer of the second superconductor material is etched to expose a portion of the first superconductor material. This may comprise lithography using a mask. Workpieces obtained at various stages of a lithographic process are illustrated schematically in FIGS. 2C to 2E.

Figure 2C:
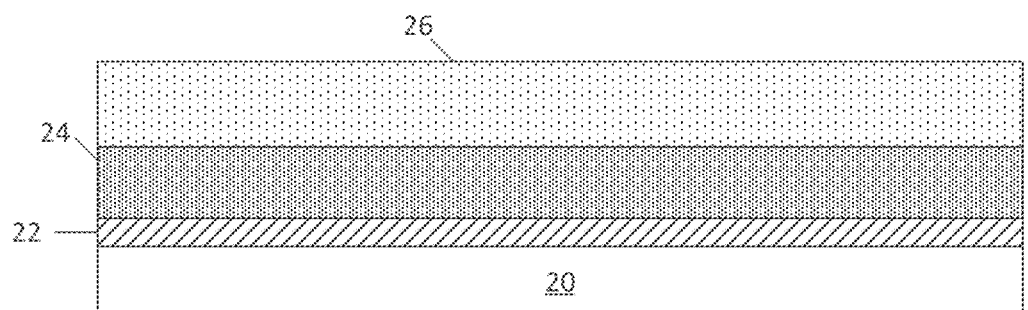

A layer of resist 26 may be applied to the layer of second superconductor material 24 to provide a workpiece as illustrated in FIG. 2C.

One example technique for applying a layer of resist is spin-coating.

A portion of the layer of resist 26 is selectively exposed. Exposure causes material in the exposed portion of the resist to undergo a reaction which alters the solubility of the resist in a developer. The nature of the exposure is selected as appropriate based on the nature of the resist.

The portions of the layer of resist to be exposed are selected based on the desired device structure, and also on the nature of the resist. The resist may be a positive resist. A positive resist becomes more soluble in the developer when exposed. Alternatively, the resist may be a negative resist. A negative resist becomes less in the developer when exposed.

Figure 2D:
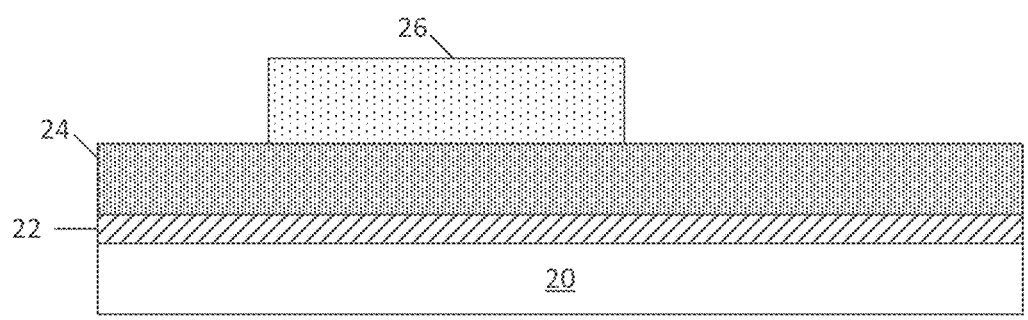

The resist 26 is developed, for example by contacting the resist with a suitable solvent. This forms a mask which exposes a portion of the second superconductor material, as shown in FIG. 2d.

Figure 2E:
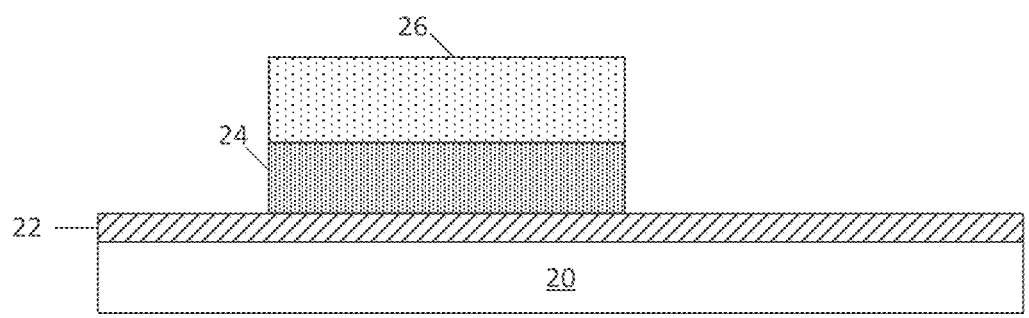

The exposed portion of the metal component is etched to form a structure as in FIG. 2e. Reagents and conditions used for the etching are selected such that the second superconductor material is removed selectively, without removing the first superconductor material.

Figure 2F:
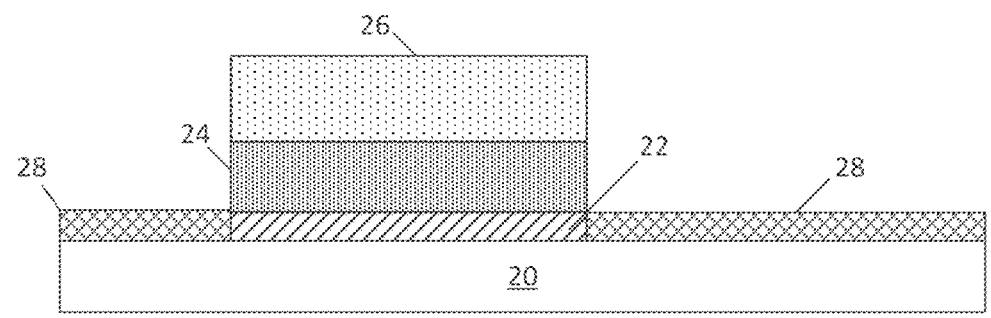

At block 104, the exposed portion of the first superconductor material 22 is oxidised to form a passivating layer 28 on the semiconductor component 20, as shown in FIG. 2f.

The oxidation may be the result of exposing the first superconductor material to the etchant. The etching and oxidation may thus be implemented as a single process step.

Alternatively, the oxidation may be the result of exposing the first superconductor material to oxygen, e.g. to oxygen in the air.

After the oxidising, any remaining resist 26 may be stripped, for example by dipping the workpiece in an appropriate solvent.

An example semiconductor-superconductor hybrid device will now be described with reference to FIG. 2g.

Figure 2G:
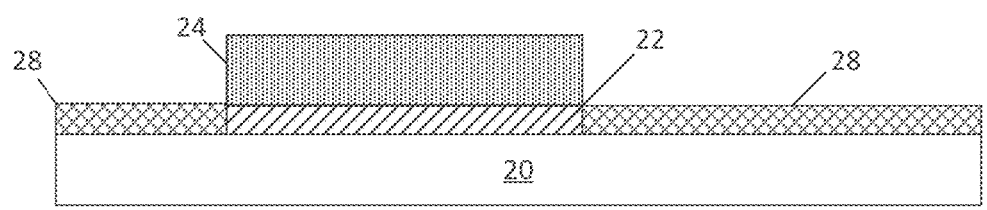

The semiconductor-superconductor hybrid device illustrated in FIG. 2g includes a semiconductor component 20, a first superconductor component 22 on a first portion of the semiconductor component 20, a passivating layer 28 on a second portion of the semiconductor component 20, and a second superconductor component 24 on the first superconductor component 22. The first and second superconductor components comprise first and second superconductor materials, respectively. The first and second superconductor materials are different from one another. The passivating layer comprises an oxide of the first superconductor material.

The first superconductor component 22 couples the second superconductor component 24 to the semiconductor component 20. Passivating layer 28 covers those portions of the semiconductor component 20 which are not provided with superconductor components. This protects the semiconductor component 20 from its environment. Oxygen from the atmosphere and certain reagents used during fabrication may otherwise degrade the semiconductor component 20.

Since the passivating layer 28 comprises an oxide, rather than a metal, an electrostatic field may be applied to the semiconductor component 20 through the passivating layer 28 when the device is in use.

FIG. 2g is a simplified schematic view of the device. Examples of semiconductor-superconductor hybrid devices include Josephson junctions and devices capable of generating a Majorana zero mode.

Figure 3:
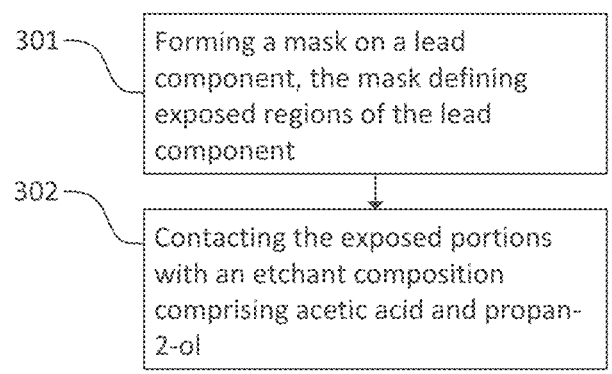
FIG. 3 is a flow chart outlining a method of etching a lead component of a workpiece.

An example method of etching a workpiece comprising a lead component will now be explained with reference to FIG. 3.

At block 301, a mask is formed on the lead component. The mask exposes portions of the lead component.

Forming a mask typically comprises applying a resist to the workpiece; selectively exposing the resist; and developing the resist. Such a process is discussed above with reference to FIG. 2.

At block 302, the exposed portions of the lead component are contacted with an etchant composition. The etchant composition comprises a solution of acetic acid in propan-2-ol. Propan-2-ol may also be referred to as isopropyl alcohol, IPA.

The amount of acetic acid present in the etchant composition may be in the range 5% to 20%, optionally 10% to 20%, 14 to 18%, 15 to 17%, or may be about 16% by volume based on the total volume of the etchant composition.

It has been found that when propan-2-ol is included in the etchant composition, damage to the mask may be prevented. Particularly, improvements have been observed for poly(methacrylic acid) masks.

II. Example Embodiments

Figure 4:
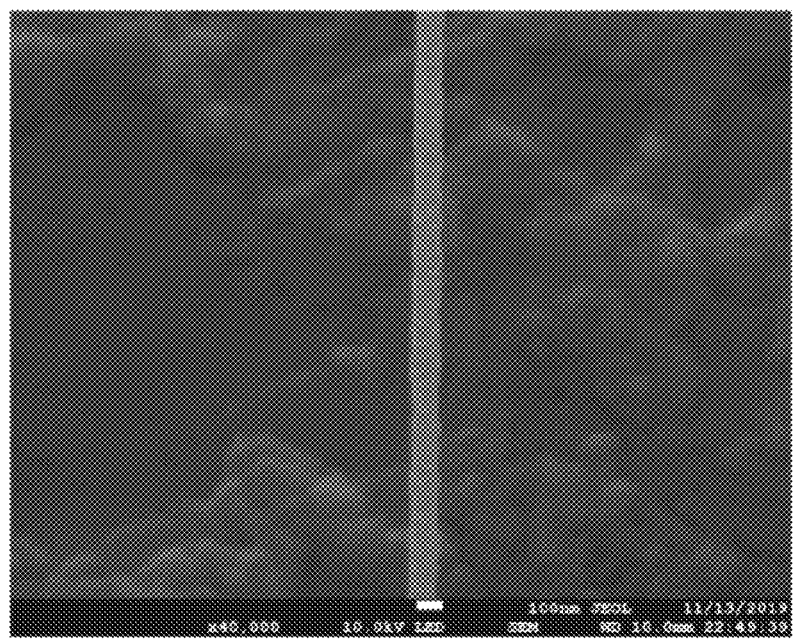
FIG. 4 is a scanning electron microscopy, SEM, micrograph of an indium arsenide nanowire having a shell of aluminium, and a shell of lead arranged on the shell of aluminium.
Figure 5A:
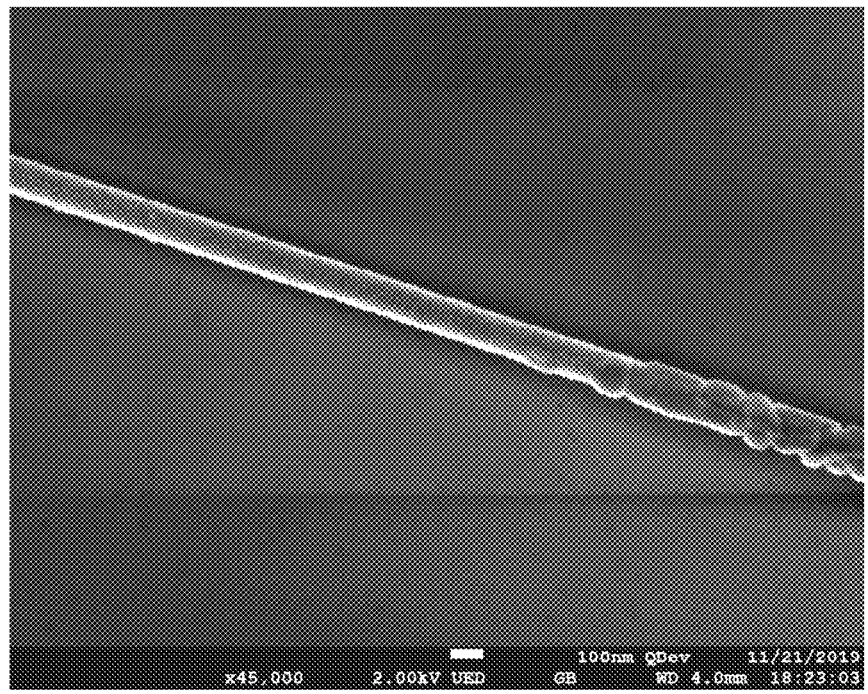
FIG. 5a is an SEM micrograph of a nanowire of the type shown in FIG. 4 after etching the lead from a selected region of the nanowire.
Figure 5B:
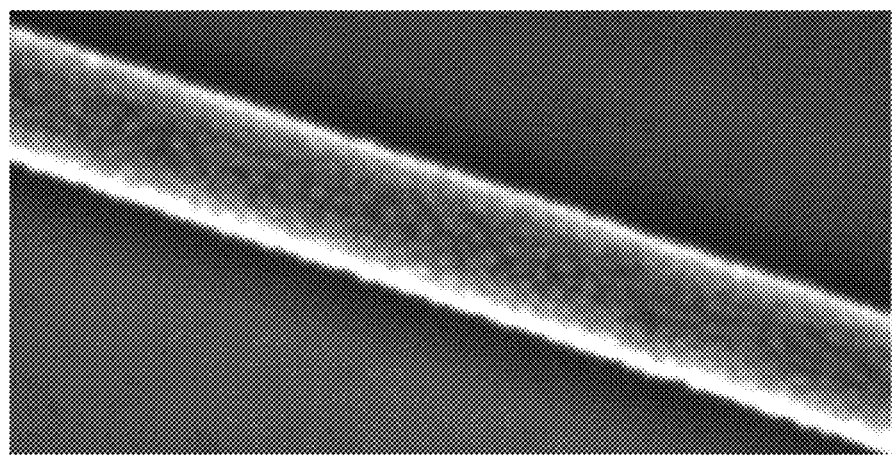
FIG. 5b is an enlarged portion of FIG. 5a showing an etched area.

A nanowire of indium arsenide was grown on a chip using the vapour-liquid-solid, VLS, technique. The indium arsenide was coated with a layer of aluminium having a thickness of approximately 1 nm, by epitaxial growth. A layer of lead was then grown epitaxially on the layer of aluminium. A scanning electron microscopy, SEM, micrograph of the nanowire is shown in FIG. 4.

The chip is spin-coated with an electron beam lithography, ELB, resist. Example resists include poly(methyl methacrylate) and methylmethacrylate.

Selected areas of the resist were exposed to an electron beam. The resist was developed chemically, forming small structures in the resist and exposing selected areas of the lead.

The exposed lead was etched using an etchant that is selective against aluminium. All lead not covered by resist is removed, exposing the aluminium layer in these regions. A solution comprising about 16% acetic acid, by volume, in propan-2-ol is particularly useful for this process. Such a solution may not attack the EBL resist.

The exposed aluminium is oxidised to form $Al_2O_3$. This oxidation may occur by a reaction with the etchant, and/or by contact with atmospheric oxygen.

The resist is then stripped using a solvent.

It will be appreciated that the above embodiments have been described by way of example only.

More generally, according to one aspect disclosed herein, there is provided a method of fabricating a semiconductor-superconductor hybrid device, which method comprises:

providing a workpiece comprising a semiconductor component, a layer of a first superconductor material on the semiconductor component, and a layer of a second superconductor material on the first superconductor material, the second superconductor material being different from the first superconductor material;

etching the layer of the second superconductor material to expose a portion of the first superconductor material; and oxidising the portion of the first superconductor material to form a passivating layer on the semiconductor. By including the layer of the first superconductor material, the layer of second superconductor material may be coupled well to the semiconductor component. The first superconductor material protects the semiconductor component during the etching, and allows for the formation of the passivating layer. The passivating layer may protect the semiconductor component while at the same time allowing an electrostatic field to be applied to the semiconductor component effectively. The semiconductor may have improved electron transport properties, as it is protected from the etchant and from atmospheric corrosion by the passivating layer.

Providing the workpiece may comprise forming the layer of the first superconductor material by epitaxial growth on the semiconductor component; and forming the layer of the second superconductor material by epitaxial growth on the layer of the first superconductor material, the second superconductor material being different from the first superconductor material. Such steps may be performed in advance of from the remaining steps of the method.

The first superconductor material may be aluminium. Aluminium has good compatibility with various semiconductor materials, in particular those of Formula 1.

In a variant, the first superconductor material may be indium.

The layer of the first superconductor material may have a thickness selected to allow for the formation of the passivating layer. The thickness may be selected such that exposed portions of the first superconductor material will be substantially fully oxidised.

In examples where the first superconductor material is aluminium, the thickness of the layer of first superconductor material is typically less than or equal to 4 nm, optionally less than or equal to 3 nm. Aluminium layers having thicknesses in these ranges may fully oxidise on exposure to air, for example.

The layer of aluminium is typically has a thickness which is greater than or equal to 2 nm. Layers with smaller thicknesses could in principle be used, however complete oxidation is already achieved for a 2 nm thick layer and the fabrication of continuous layers having thicknesses below 2 nm may be difficult.

In examples where the first superconductor material is indium, the layer of first superconductor material may have a thickness of less than or equal to 10 nm, or less than or equal to 8 nm. Indium layers having thicknesses in these ranges may fully oxidise on exposure to air, for example.

The nature of the second superconductor material is not particularly limited provided that a layer of the material can be fabricated on the layer of first superconductor material without disrupting the structure of the layer of first superconductor material. Typically, the second superconductor material is selected to have a larger superconducting gap than aluminium.

Examples of materials useful as the second superconductor material include materials selected from lead, indium, vanadium, niobium, tantalum, tin, and rhenium. These materials in particular may be grown on aluminium without exposing the aluminium to excessive temperatures.

The second superconductor material may be lead. Lead has a superconducting gap which is more than 6 times larger than aluminium (C. Kittel (2004) Introduction to Solid State Physics. Wiley. ISBN: 9780471415268).

The thickness of the layer of second superconductor material may be selected as appropriate depending on the materials chosen. For some materials, layer thickness may have an impact on superconductivity. The thickness is selected to allow the material to display superconductivity at the operating temperature of the device.

In examples where lead is used, the thickness of the lead layer is not particularly limited. A monolayer of lead may sustain superconductive properties (Cherkez et al, Phys. Rev. X 4, 011033 (2014)). Resistance to the effects of an applied magnetic field may increase as thickness decreases. Providing a lead layer which is as thin as possible may be preferred for some applications.

Niobium may be a preferred second superconductor material for some applications. Niobium is the strongest elemental superconductor, i.e. has a particularly large superconductor gap.

The etching is performed using conditions selected such that a portion of the second superconductor material is removed to expose a portion of the first superconductor material. Partial removal, i.e. a reduction in thickness, of the portion of first superconductor material may be tolerated so long as the etching does not expose any portion of the semiconductor material and the passivating layer will be thick enough to protect the semiconductor component from oxidation. The thickness of the first superconductor layer may be increased to compensate for partial removal at the etching stage.

In examples where the second superconductor is lead, the etching may comprise contacting the second superconductor material with an etchant composition comprising an acid selected from nitric acid and acetic acid.

In examples where the acid is acetic acid, the etchant composition may be glacial acetic acid. Alternatively, the etchant composition may comprise acetic acid and propan-2-ol. This etchant composition has been found to be particularly useful. It has been observed that attack of masks used in lithography by the etchant is reduced when propan-2-ol is included in the etchant composition.

The acetic acid may be present in the etchant composition in an amount in the range 5% to 20%, e.g. 10% to 20%, 14 to 18%, or 15 to 17%, or in an amount of about 16%, by volume based on the total volume of the etchant composition. Concentrations in these ranges are particularly effective for avoiding degradation of the mask, while still providing a good etching rate.

This etchant composition may be particularly advantageous when used in combination with a resist comprising an acrylate polymer. Examples of acrylate polymers include poly(methacrylic acid), poly(acrylic acid), poly(methyl acrylate), and methylmethacrylate-methacrylic acid copolymers.

In variants where the second superconductor material comprises niobium, the etching may comprise reactive ion etching using chloride ions. Reactive ion etching using chloride ions selectively removes niobium, without removing aluminium.

The methods described herein may be performed at a temperature less than or equal to 0° C. This is particularly applicable when the first superconductor material comprises aluminium. It has been found that it is preferable to keep the temperature of the aluminium as low as possible during fabrication. An aluminium layer which is not covered by another component tends to degrade and become discontinuous, forming discrete blobs of aluminium, if exposed to excessive heat. Controlling the temperature during fabrication may therefore improve the properties of the finished device.

The methods provided herein may further comprise, before the etching:
 forming a layer of resist on the layer of second superconductor material;
 selectively exposing the layer of resist; and
 developing the resist to form a mask on the layer of second superconductor material. In other words, the etching may be a lithographic process.

The resist may be a photoresist. In other words, the etching may comprise optical lithography. Developers used for optical lithography may damage certain materials, in particular aluminium. However, in the methods provided herein, the second superconductor component covers the first superconductor component thereby protecting the first superconductor component from the developer. The workpiece used may therefore be compatible with optical lithography processes.

Optical lithography allows the resist to be exposed quickly. Optical lithography may therefore be preferred for the fabrication of larger devices.

Alternatively, the resist may be an electron beam resist. In other words, the etching may comprise electron beam lithography. Electron beam lithography may allow for higher resolution than optical lithography.

Examples of electron beam resists include acrylate polymers such as poly(methacrylic acid), poly(methyl acrylate), and methylmethacrylate-methacrylic acid copolymers.

The nature of the exposing and developing steps may be selected as appropriate depending on the resist chosen. One of skill in the art will be familiar with lithographic processes.

The methods provided herein may further comprise fabricating a gate electrode for applying an electrostatic field to the semiconductor component. Electrostatic gating is useful for various types of semiconductor-superconductor hybrid devices. Since the passivating layer obtained using the methods described herein comprises an oxide, the semiconductor component of the device can be electrostatically gated through the passivating layer.

Another aspect provides a semiconductor-superconductor hybrid device, comprising:
- a semiconductor component;
- a first superconductor component on a first portion of the semiconductor component, the first superconductor component comprising a first superconductor material;
- a second superconductor component on the first superconductor component, the second superconductor component comprising a second superconductor material different from the first superconductor material; and
- a passivating layer on a second portion of the semiconductor component, the passivating layer comprising an oxide of the first superconductor material. The layer of the first superconductor material may improve coupling of the second superconductor material to the semiconductor component. The second superconductor material may have a larger superconductor gap than the first superconductor material. The passivating layer may protect the semiconductor component from e.g. oxidation. This may result in the semiconductor having improved electron transport properties compared to a device lacking the passivating layer.

The passivating layer is obtainable by the method as described above.

The first superconductor component and the passivating layer may be formed integrally to one another. In other words, a continuous layer may be arranged on the semiconductor component, the continuous layer comprising a portion corresponding to the passivating layer, and a portion corresponding to the first superconductor component.

The first superconductor material may be aluminium.

The second superconductor material may be selected from lead, indium, vanadium, niobium, tantalum, tin, and rhenium. For example, the second superconductor material may be lead.

The semiconductor component may comprise a material of Formula 1, for example, indium arsenide.

The device may further comprise one or more additional components. An additional component may be provided on a third portion of the semiconductor component, with the passivating layer extending over the additional component. Examples of such additional components include ferromagnetic insulator components.

The semiconductor-superconductor hybrid device may further comprise a gate electrode for applying an electrostatic field to the semiconductor component.

Examples of semiconductor-superconductor hybrid devices include Josephson junctions and devices capable of generating Majorana zero modes.

A still further aspect provides a method of etching a workpiece comprising a lead component, which method comprises:
- forming a mask on the lead component, the mask defining exposed regions of the lead component; and
- contacting the exposed regions with an etchant composition,
- wherein the etchant composition comprises acetic acid and propan-2-ol. Etchant compositions comprising acetic acid and propan-2-ol may allow for the etching of lead without developing resist materials. This may allow for etching with improved resolution. The acetic acid may be present in the etchant composition in an amount in the range 5% to 20%, e.g. 10% to 20%, optionally 14 to 18%, further optionally 15 to 17%, or about 16% by volume based on the total volume of the etchant composition. Concentrations in these ranges are particularly effective for avoiding degradation of the mask, while still providing a good etching rate.

The mask may comprise an acrylate polymer. Examples of acrylate polymers include poly(methacrylic acid), poly(acrylic acid), poly(methyl acrylate), and methylmethacrylate-methacrylic acid copolymers.

The workpiece may further comprise an aluminium component. In such examples, the method may further comprise contacting the aluminium component with the etchant composition to oxidise the aluminium component. The aluminium component may be configured to be fully oxidised. For example, the aluminium component may have a thickness less than or equal to 4 nm.

The workpiece may further comprise a semiconductor component. The semiconductor component may be arranged under the aluminium component whereby the aluminium component protects the semiconductor component from the etchant composition.

A related aspect provides the use of propan-2-ol in an etchant composition to prevent degradation of a mask by the etchant composition, wherein the etchant composition includes acetic acid.

The acetic acid may be present in the etchant composition in an amount in the range 5% to 20%, optionally 10% to 20%, optionally 14 to 18%, further optionally 15 to 17%, or about 16% by volume based on the total volume of the etchant composition. Concentrations in these ranges are particularly effective for avoiding degradation of the mask, while still providing a good etching rate.

The mask may comprise an acrylate polymer. Examples of acrylate polymers include poly(methacrylic acid), poly(acrylic acid), poly(methyl acrylate), and methylmethacrylate-methacrylic acid copolymers.

A still further aspect provides a kit comprising an etchant composition and a composition for forming a lithography mask, wherein the etchant composition comprises acetic acid and propan-2-ol. The acetic acid may be present in the etchant composition in an amount of 10% to 20% by volume. The composition for forming the lithography resist may be for forming a photoresist or for forming an electron beam resist.

The composition for forming a lithography mask may comprise a composition for forming a layer of an acrylate polymer on a workpiece. Examples of acrylate polymers include poly(methacrylic acid), poly(acrylic acid), poly(methyl acrylate), and methylmethacrylate-methacrylic acid copolymers.

Provided herein are the following clauses:

Clause 1. A method of fabricating a semiconductor-superconductor hybrid device, which method comprises:
- providing a workpiece comprising a semiconductor component, a layer of a first superconductor material on the semiconductor component, and a layer of a second superconductor material on the first superconductor material, the second superconductor material being different from the first superconductor material;
- etching the layer of the second superconductor material to expose a portion of the first superconductor material; and
- oxidising the portion of the first superconductor material to form a passivating layer on the semiconductor.

Clause 2. The method according to Clause 1, wherein the first superconductor material is aluminium.

Clause 3. The method according to Clause 1 or Clause 2, wherein the layer of the first superconductor material has a thickness of less than or equal to 3 nm.

Clause 4. The method according to Clause 3, wherein the second superconductor material is selected from lead, indium, vanadium, tantalum, tin, rhenium and niobium.

Clause 5. The method according to Clause 4, wherein the second superconductor material is lead.

Clause 6. The method according to Clause 5, wherein the etching comprises contacting the second superconductor material with an etchant composition comprising an acid selected from nitric acid and acetic acid.

Clause 7. The method according to Clause 6, wherein the acid is acetic acid; wherein etchant composition further comprises propan-2-ol; and wherein the concentration of the acetic acid in the etchant composition is 5% to 20% by volume.

Clause 8. The method according to Clause 4, wherein the second superconductor material is niobium, and wherein the etching comprises reactive ion etching using chloride ions.

Clause 9. The method according to any preceding Clause, which is performed at a temperature less than or equal to 0° C.

Clause 10. The method according to any preceding Clause, further comprising, before the etching:
- forming a layer of resist on the layer of second superconductor material;
- selectively exposing the layer of resist; and
- developing the resist to form a mask on the layer of second superconductor material.

Clause 11. The method according to any preceding Clause, further comprising fabricating a gate electrode for applying an electrostatic field to the semiconductor component.

Clause 12. A semiconductor-superconductor hybrid device, comprising:
- a semiconductor component;
- a first superconductor component over a first portion of the semiconductor component, the first superconductor component comprising a first superconductor material;
- a second superconductor component on the first superconductor component, the second superconductor component comprising a second superconductor material different from the first superconductor material; and
- a passivating layer over a second portion of the semiconductor component, the passivating layer comprising an oxide of the first superconductor material.

Clause 13. The semiconductor-superconductor hybrid device according to Clause 12, wherein the first superconductor material is aluminium.

Clause 14. The semiconductor-superconductor hybrid device according to Clause 12 or Clause 13, wherein the second superconductor material is selected from lead, indium, vanadium, tantalum, tin, rhenium and niobium.

Clause 15. The semiconductor-superconductor hybrid device according to any of Clauses 12 to 14, further comprising an additional component on the semiconductor component, wherein the first superconductor component and the passivating layer are arranged on the additional component.

Clause 16. The semiconductor-superconductor hybrid device according to any of Clauses 12 to 15, further comprising a gate electrode for applying an electrostatic field to the semiconductor component.

Clause 17. A method of etching a workpiece comprising a lead component, which method comprises:
- forming a mask on the lead component, the mask defining exposed regions of the lead component; and
- contacting the exposed regions with an etchant composition,
- wherein the etchant composition comprises acetic acid and propan-2-ol.

Clause 18. The method according to Clause 17, wherein the acetic acid is present in the etchant composition in an amount in the range 10% to 20% by volume.

Clause 19. The method according to Clause 17 or Clause 18, wherein the workpiece further comprises an aluminium component; and wherein the method further comprises contacting the aluminium component with the etchant composition to oxidise the aluminium component.

Clause 20. The method according to Clause 19, wherein the workpiece further comprises a semiconductor component, the semiconductor component being arranged under the aluminium component whereby the aluminium component protects the semiconductor component from the etchant composition.

Other variants or use cases of the disclosed techniques may become apparent to the person skilled in the art once given the disclosure herein. The scope of the disclosure is not limited by the described embodiments but only by the accompanying claims.

What is claimed is:

1. A semiconductor-superconductor hybrid device, comprising:
   - a semiconductor component;
   - a first superconductor component over a first portion of the semiconductor component, the first superconductor component comprising a first superconductor material;
   - a second superconductor component on the first superconductor component, the second superconductor component comprising a second superconductor material different from the first superconductor material; and
   - a passivating layer over a second portion of the semiconductor component, the passivating layer comprising an oxide of the first superconductor material.

2. The semiconductor-superconductor hybrid device according to claim 1, wherein the first superconductor material is aluminium.

3. The semiconductor-superconductor hybrid device according to claim 1, wherein the second superconductor material is selected from the group consisting of lead, indium, vanadium, tantalum, tin, rhenium and niobium.

4. The semiconductor-superconductor hybrid device according to claim 1, further comprising an additional component on the semiconductor component, wherein the first superconductor component and the passivating layer are arranged on the additional component.

5. The semiconductor-superconductor hybrid device according to claim 1, further comprising a gate electrode situated to apply an electrostatic field to the semiconductor component.

6. The semiconductor-superconductor hybrid device according to claim 1, wherein the first superconductor material has a thickness of less than or equal to 3 nm.

7. The semiconductor-superconductor hybrid device according to claim 1, wherein the second superconductor material is lead.

8. The semiconductor-superconductor hybrid device according to claim 1, wherein the second superconductor material is niobium.

9. The semiconductor-superconductor hybrid device according to claim 1, wherein thickness of the passivating layer is selected to be thick enough to protect the hybrid device from oxidation.

10. The semiconductor-superconductor hybrid device according to claim 1, wherein the semiconductor component comprises III-V semiconductor materials of the general formula:

where x is in the range 0 to 1.

11. The semiconductor-superconductor hybrid device according to claim 1, wherein the semiconductor component comprises at least one of indium antimonide, indium arsenide.

12. The semiconductor-superconductor hybrid device according to claim 1, wherein the semiconductor component comprises a ternary mixture comprising 50% indium on a molar basis and variable proportions of arsenic and antimony.

13. The semiconductor-superconductor hybrid device according to claim 1, wherein the semiconductor component is a nanowire.

14. The semiconductor-superconductor hybrid device according to claim 1, wherein the second superconductor material comprises at least one of: NbN, NbTiN, $MgB_2$, MoRe, or Fe-based superconductors.

15. A semiconductor-superconductor hybrid device, comprising:
   a semiconductor component;
   a first superconductor component over a first portion of the semiconductor component, the first superconductor component comprising a layer of a first superconductor material, said first superconductor material being aluminium or indium;
   a second superconductor component on the first superconductor component, the second superconductor component comprising a second superconductor material different from the first superconductor material; and
   a passivating layer over a second portion of the semiconductor component, the passivating layer comprising an oxide of the first superconductor material.

16. The semiconductor-superconductor hybrid device according to claim 15, wherein the second superconductor material is selected from lead, indium, vanadium, tantalum, tin, rhenium and niobium.

17. The semiconductor-superconductor hybrid device according to claim 15, wherein the layer of the first superconductor material has a thickness of less than or equal to 3 nm.

18. The semiconductor-superconductor hybrid device according to claim 15, wherein the semiconductor component comprises at least one of indium antimonide, indium arsenide.

19. The semiconductor-superconductor hybrid device according to claim 15, wherein the second superconductor material comprises at least one of: NbN, NbTiN, $MgB_2$, MoRe, or Fe-based superconductors.

20. A semiconductor-superconductor hybrid device, comprising:
   a semiconductor component;
   a first superconductor component over a first portion of the semiconductor component, the first superconductor component comprising a first superconductor material that undergoes self-limiting oxidation;
   a second superconductor component on the first superconductor component, the second superconductor component comprising a second superconductor material different from the first superconductor material; and
   a passivating layer over a second portion of the semiconductor component, the passivating layer comprising an oxide of the first superconductor material.

21. The semiconductor-superconductor hybrid device according to claim 20, wherein the second superconductor material is selected from lead, indium, vanadium, tantalum, tin, rhenium and niobium.

* * * * *